(12) United States Patent
Jaggers

(10) Patent No.: US 11,817,436 B2
(45) Date of Patent: Nov. 14, 2023

(54) COMMON COOLING SOLUTION FOR MULTIPLE PACKAGES

(71) Applicant: ADVANCED MICRO DEVICES, INC., Santa Clara, CA (US)

(72) Inventor: Christopher M. Jaggers, Austin, TX (US)

(73) Assignee: ADVANCED MICRO DEVICES, INC.

( * ) Notice: Subject to any disclaimer, the term of this patent is extended or adjusted under 35 U.S.C. 154(b) by 0 days.

(21) Appl. No.: 17/360,862

(22) Filed: Jun. 28, 2021

(65) Prior Publication Data
US 2022/0415866 A1   Dec. 29, 2022

(51) Int. Cl.
| | | |
|---|---|---|
| *H01L 25/10* | (2006.01) | |
| *H01L 25/18* | (2023.01) | |
| *H01L 23/367* | (2006.01) | |
| *H01L 23/427* | (2006.01) | |
| *H01L 23/467* | (2006.01) | |
| *H01L 23/473* | (2006.01) | |

(52) U.S. Cl.
CPC ............ *H01L 25/105* (2013.01); *H01L 25/18* (2013.01); *H01L 23/367* (2013.01); *H01L 23/427* (2013.01); *H01L 23/467* (2013.01); *H01L 23/473* (2013.01)

(58) Field of Classification Search
CPC ......... H01L 23/36–3675; H01L 23/427; H01L 23/46; H01L 23/50; H01L 23/467; H01L 23/473; H01L 23/31; H01L 23/3677; H01L 23/3733; H01L 23/3737; H05K 1/0272; H05K 1/0201–0212; H05K 1/181–188; H05K 7/20272; H05K 7/20772; H05K 7/20872; H05K 7/20927; H05K 2201/064; H05K 2201/10166
See application file for complete search history.

(56) References Cited

U.S. PATENT DOCUMENTS

| | | | | |
|---|---|---|---|---|
| 4,504,886 | A * | 3/1985 | Cygan | H05K 7/12 257/713 |
| 5,291,064 | A | 3/1994 | Kurokawa | |
| 5,305,185 | A * | 4/1994 | Samarov | H01L 23/4006 174/16.3 |
| 5,990,418 | A * | 11/1999 | Bivona | H01L 23/16 174/547 |
| 11,581,235 | B2 * | 2/2023 | Mallik | H01L 23/3128 |
| 2008/0142954 | A1 * | 6/2008 | Hu | H01L 25/0655 257/713 |
| 2008/0237841 | A1 * | 10/2008 | Arana | H01L 23/433 257/E23.11 |
| 2015/0340303 | A1 * | 11/2015 | Oh | H01L 25/071 438/109 |
| 2016/0329312 | A1 * | 11/2016 | O'Mullan | H01L 25/0655 |
| 2018/0102776 | A1 * | 4/2018 | Chandrasekar | G06F 1/3275 |
| 2018/0374776 | A1 | 12/2018 | Liu et al. | |

(Continued)

OTHER PUBLICATIONS

International Search Report and Written Opinion, PCT/US2022/027037, dated Aug. 30, 2022, 8 pages.

*Primary Examiner* — Amir A Jalali

(57) ABSTRACT

An apparatus for a common cooling solution for multiple packages of a common height, including: a first die package; a second die package having a same height as the first die package; and a cooling element thermally coupled to the first die package and the second die package by a planar surface of the cooling element.

20 Claims, 5 Drawing Sheets

(56) References Cited

U.S. PATENT DOCUMENTS

| | | | |
|---|---|---|---|
| 2019/0006291 A1* | 1/2019 | Neal | H01L 23/373 |
| 2019/0385929 A1* | 12/2019 | Ku | H01L 25/0655 |
| 2020/0020606 A1* | 1/2020 | Kim | H01L 23/053 |
| 2020/0083136 A1* | 3/2020 | Dry | H01L 21/563 |
| 2020/0105642 A1* | 4/2020 | Gandhi | H01L 23/367 |
| 2020/0176352 A1* | 6/2020 | Chang | H01L 23/4334 |
| 2020/0227384 A1* | 7/2020 | Liff | H01L 23/544 |
| 2020/0350229 A1* | 11/2020 | Chang | H01L 23/3733 |
| 2021/0233833 A1* | 7/2021 | Ku | H01L 21/4882 |
| 2021/0320048 A1* | 10/2021 | Limaye | H01L 25/18 |
| 2021/0384096 A1* | 12/2021 | Lee | H01L 23/40 |

* cited by examiner

COMMON COOLING SOLUTION FOR MULTIPLE PACKAGES

BACKGROUND

Computing devices include one or more cooling elements to dissipate heat generated by various components, such as processor cores. Such cooling elements include, for example, heat sinks, fluid cooling systems (e.g., water cooling systems), vapor chambers, heat pipes, fans, and the like to conduct heat to fans that dissipate the heat out of the computing device. Each die package is thermally coupled to a cooling element to dissipate the heat generated by the die package. Complications arise when the computing device includes multiple die packages that must be coupled to a cooling element.

DETAILED DESCRIPTION

Figure 1:
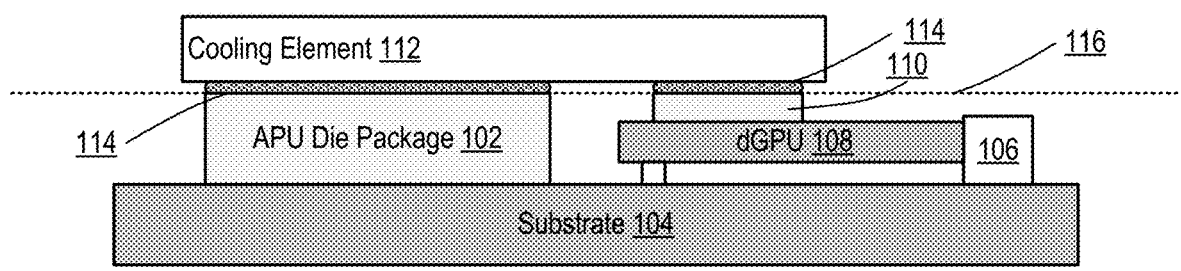
FIG. 1 is a diagram of an example apparatus for a common cooling solution for multiple packages according to some embodiments.

In some embodiments, an apparatus for a common cooling solution for multiple packages of a common height includes: a first die package; a second die package having a same height as the first die package; and a cooling element thermally coupled to the first die package and the second die package by a planar surface of the cooling element.

In some embodiments, the first die package includes an application processing unit (APU) die package. In some embodiments, the first die package is bonded to a first substrate and the second die package is bonded to a second substrate. In some embodiments, the apparatus further includes a discrete graphics processing unit (dGPU) including the second substrate and the second die package. In some embodiments, the apparatus further includes: a first portion of thermal interface material between the first die package and the cooling element; a second portion of thermal interface material between the second die package and the cooling element; and wherein the first portion of thermal interface material and the second portion of thermal interface material are of a substantially same thickness. In some embodiments, one or more of the first portion of thermal interface material or the second portion of thermal interface material includes a thermal paste. In some embodiments, the cooling element includes a fluid-cooled cooling element. In some embodiments, the planar surface of the cooling element includes a surface of a layer of conductive metal.

In some embodiments, a semiconductor chip device includes: a semiconductor chip substrate; a first die package mounted on the semiconductor chip substrate, the first die package comprising an exposed surface; and a second die package electrically coupled to the semiconductor chip substrate, the second die package having an exposed surface at a same height as the first die package, wherein the exposed surface of the first and second die package are thermally couplable to a cooling element.

In some embodiments, the first die package includes an application processing unit (APU) die package. In some embodiments, the first die package is bonded to a first substrate and the second die package is bonded to a second substrate. In some embodiments, the mobile computing device further includes a discrete graphics processing unit (dGPU) including the second substrate and the second die package. In some embodiments, the mobile computing device further includes: a first portion of thermal interface material between the first die package and the cooling element; a second portion of thermal interface material between the second die package and the cooling element; and wherein the first portion of thermal interface material and the second portion of thermal interface material are of a substantially same thickness. In some embodiments, one or more of the first portion of thermal interface material or the second portion of thermal interface material includes a thermal paste.

In some embodiments, a method for a common cooling solution for multiple packages of a common height includes thermally coupling a planar surface of a cooling element to a first die package and thermally coupling the planar surface of the cooling element to a second die package having a same height as the first die package.

In some embodiments, thermally coupling the planar surface of the cooling element to the first die package includes thermally coupling the planar surface of the cooling element to the first die package via a first portion of thermal interface material; and thermally coupling the planar surface of the cooling element to the second die package includes thermally coupling the planar surface of the cooling element to the second die package via a second portion of thermal interface material; and wherein the first portion of thermal interface material and the second portion of thermal interface material are of a substantially same thickness. In some embodiments, wherein the first die package includes an application processing unit (APU) die package. In some embodiments, the second die package includes a discrete graphics processing unit (dGPU) die package. In some embodiments, the cooling element includes a fluid-cooled cooling element. In some embodiments, the planar surface of the cooling element includes a surface of a layer of conductive metal.

Computing devices include one or more cooling elements to dissipate heat generated by various components, such as processor cores. Such cooling elements include, for example, heat sinks, fluid cooling systems (e.g., water cooling systems), vapor chambers, heat pipes, fans, and the like to conduct heat to fans that dissipate the heat out of the computing device. Each die package is thermally coupled to a cooling element to dissipate the heat generated by the die package.

Complications arise when the computing device includes multiple die packages that must be coupled to a cooling element. In some existing solutions, each die package is thermally coupled to a respective cooling element, such that any given die package is thermally coupled to a single cooling element and each cooling element is thermally coupled to a single die package. This solution increases the space used within the computing device by cooling elements, which presents significant drawbacks in mobile devices where internal space is at a premium and should be conserved. Moreover, the operation of multiple cooling elements requires more power than operating a single cooling element over multiple die packages.

The use of a single cooling element thermally coupled to multiple die packages also introduces problems and limitations. In some solutions, a single cooling element will typically rely on surface of a single, substantially continuous plane of conductive material (e.g., copper) to contact with each of the die packages. However, the contact surfaces of the die packages will generally be at different heights (e.g., Z-axis heights). For example, a die package for a processor will generally have a different height than the die package for a graphics processing unit (GPU) processor as they may come from different manufacturers, or not conform to a particular standard defining the height of die packages. Accordingly, the cooling element cannot contact both die packages in a uniform fashion.

Instead, in some solutions, a die package having a lesser height will have additional amounts of a thermal interface material, such as thermal paste or thermal pads, applied to the die package in order to compensate for the height differential between die packages. Accordingly, the die package of lesser height will need to conduct heat though thicker layers of thermal interface material in order to dissipate heat through the cooling element. The additional layers of thermal interface material will result in a greater thermal resistance compared to the other die package with less thermal interface material between the other die package and the cooling element, reducing the thermal transfer and cooling efficiency for the die package with additional thermal interface material.

In other solutions, a cooling element is installed at a slope or slant such that the bottom surface of the cooling element contacts the die packages at an angle. Using this solution, the cooling element fails to uniformly contact the die packages, and will require non-uniform layers of thermal interface material to fill air gaps where the cooling element fails to contact the die packages. This results in a substantial increase in thermal resistance caused by the increasingly thick portions of thermal interface material.

In further solutions, the bottom surface of the cooling element will include a broken, step-like plane of conductive material such that the die package of lesser height will conduct heat to the cooling element through a thicker layer of conductive material while the die package of greater height will conduct heat to the cooling element through a thinner layer of conductive material. This again increases the thermal resistance between the die package of lesser height and the cooling element when compared to the die package of lesser height. In solutions where the die package of lesser height has increased thermal resistance to the cooling element, such a die package cannot be as efficiently cooled and is limited in operations that may increase the operational temperature of the die package, such as overclocking.

To address these concerns, FIG. 1 shows an example diagram of an apparatus 100 for a common cooling solution for multiple packages according to embodiments of the present disclosure. The example apparatus 100 can be implemented in a variety of computing devices, including desktop computing devices, mobile computing devices, gaming devices, set top boxes, and the like. FIG. 1 shows a cross-sectional or profile view of the apparatus 100.

The example apparatus 100 of FIG. 1 includes an application processing unit (APU) die package 102 bonded (e.g., packaged) to a substrate 104. The APU die package 102 is a die of an APU that has been bonded to the substrate to form a die package. For example, the APU has been packaged with the substrate 104 using pins (e.g., input/output pins and the like) bonded to the substrate 104 using solder balls or other conductive bonding material as can be appreciated. The substrate 104 includes, for example, a printed circuit board (PCB) such as a motherboard of a computing device.

A peripheral interface 106 is coupled to the substrate, allowing for peripheral devices to be installed in the peripheral interface 106 and communicate with the APU die package 102 and other components of the apparatus via signal pathways in the substrate 104 (e.g., conductive traces, buses, and the like). For example, the peripheral interface 106 includes a Peripheral Component Interface Express (PCIe) interface or other interface as can be appreciated.

In the example apparatus 100, a discrete Graphics Processing Unit (dGPU) that includes a dGPU die package 110 and a dGPU substrate 108 is installed in the peripheral interface 106. The dGPU includes dedicated hardware components for performing graphics operations or similar operations as can be appreciated, including matrix math operations, machine learning operations, and the like. The dGPU die package 110 is a dedicated processor die of the dGPU bonded to the dGPU substrate 108 that facilitates the processing of jobs or operations submitted to the dGPU for execution.

The APU die package 102 and dGPU die package 110 are thermally coupled to a cooling element 112. The cooling element 112 can be implemented as a variety of cooling elements as appreciated by one skilled in the art, including fluid-cooled (e.g., water cooled) cooling elements, heat pipes, vapor chambers, heat sinks, radiators, fans, and the like. The cooling element 112 is thermally coupled to the APU die package 102 and dGPU die package 110 via a bottom surface of the cooling element 112. The bottom surface of the cooling element 112 is a substantially unbroken plane of conductive material (e.g., copper) that uniformly contacts the APU die package 102 and dGPU die package 110 to conduct heat from the APU die package 102 and dGPU die package 110. Accordingly, the bottom surface of the cooling element 112 includes a layer of conductive material of substantially constant thickness. One skilled in the art will appreciate that, in addition to the plane of conductive material contacting the APU die package 102 and dGPU die package 110, the cooling element 112 includes other components to facilitate the dissipation of heat from the APU die package 102 and dGPU die package 110 as described above.

In some embodiments, the cooling element 112 is thermally coupled to the APU die package 102 and dGPU die package 110 via one or more portions of thermal interface material 114. The thermal interface material 114 is a material or component that is applied to the APU die package 102 and dGPU die package 110 to eliminate air gaps between the APU die package 102 or dGPU die package 110 and the cooling element 112. For example, the thermal interface material 114 includes thermal paste, thermal conducting pads, or other materials as can be appreciated. One skilled in the art will appreciate that the cooling element 112 contacting the APU die package 102 or dGPU die package 110 as described herein will also include the cooling element 112 contacting a layer of thermal interface material 114 applied to the APU die package 102 or dGPU die package 110. As shown in the example apparatus of FIG. 1, the portions of thermal interface material 114 applied to the APU die package 102 and dGPU die package 110 are of substantially the same thickness.

As shown in the example apparatus 100 of FIG. 1, the APU die package 102 and the dGPU die package 110, when coupled to the substrate 104 (e.g., installed in the apparatus 100), rest at the same height 116. Thus, a surface of the APU die package 102 (e.g., opposite a side contacting the substrate 104) and a surface of the dGPU die package 110 (e.g., opposite a side contacting the dGPU substrate 108) are substantially coplanar. For example, the APU die package 102 or the dGPU die package 110 is ground, leveled, or otherwise modified in height such that both the APU die package 102 or the dGPU die package 110 are substantially coplanar when installed in the apparatus. Accordingly, as the portions of thermal interface material 114 applied to the APU die package 102 and dGPU die package 110 are of substantially the same thickness, the height of a surface of the portions of thermal interface material 114 applied to the APU die package 102 and dGPU die package 110 are of substantially the same height.

The bottom surface of the cooling element 112 is a substantially unbroken plane in that the bottom surface is level and parallel to the APU die package 102 and dGPU die package 110 without substantial variation in height or thickness (e.g., in contrast to a step-like or curved surface that would be required in order to contact an APU die package 102 and dGPU die package 110 of differing heights). As the APU die package 102 and the dGPU die package 110 are of substantially the same height, the cooling element 112 is able to uniformly contact the APU die package 102 and the dGPU die package 110 using the substantially unbroken plane of conductive material at the bottom surface of the cooling element 112. Thus, both the APU die package 102 and dGPU die package 110 are thermally coupled to the cooling element 112 without any increases in thermal resistance caused by additional layers of thermal interface material 114 or level variations in the bottom surface of the cooling element 112 that would be required were the APU die package 102 and dGPU die package 110 not of the same height when installed on the apparatus 100 (e.g., coupled to the substrate 104).

Consider an example where the apparatus 100 includes a mobile computing device such as a laptop computer. Were the APU die package 102 to be at a lower height than the dGPU die package 110, additional layers of thermal interface material 114 or conductive material in the cooling element 112 would be required in order to thermally couple both the APU die package 102 and dGPU die package 110 to the cooling element 112. This would increase the thermal resistance between the APU die package 102 and the cooling element 112, reducing the overall cooling capabilities of the cooling element 112 for the APU die package 102. Where the apparatus 100 is capable of overclocking the APU die package 102 or increasing voltage to the APU die package 102 depending on executed workloads, such overclocking and voltage increases would be limited due to the reduced cooling capabilities of the cooling element 112. Instead, as the APU die package 102 and dGPU die package 110 are at the same height, the cooling element 112 is able to provide more cooling capabilities to the APU die package 102, thereby allowing for increased overclocking and voltage capabilities for the APU die package 102. This is particularly beneficial in embodiments including an APU die package 102 and the dGPU die package 110, as APU die packages 102 typically have greater thermal densities and heat output compared to dGPU die packages 110. Thus, an APU die package 102 benefits from the increased cooling capabilities afforded by the embodiments presented herein to both accommodate for their increased thermal densities and allow for increased overclocking and voltage configurations.

Although the example apparatus 100 is described in the context of an APU die package 102 and dGPU die package 110 of the same height, it is understood that the approaches for a common cooling solution for multiple packages described herein are applied to other component or device configurations. For example, instead of an APU die package 102, in some embodiments, an apparatus for a common cooling solution for multiple packages will include a central processing unit (CPU) die package. Accordingly, a common cooling solution for multiple packages is implemented using multiple CPU die packages, a CPU die package and a dGPU, a CPU die package and a separate integrated Graphics Processing Unit (iGPU) die package, and the like.

As another example, instead of a dGPU substrate 108 and dGPU die package 110, in some embodiments, an apparatus a common cooling solution for multiple packages will include another APU die package 102 or other die package as can be appreciated. One skilled in the art will appreciate that the approaches described herein for a common cooling solution for multiple packages are applicable to any embodiments by which multiple die packages of the same height are thermally coupled to a same single cooling element 112.

Figure 2:
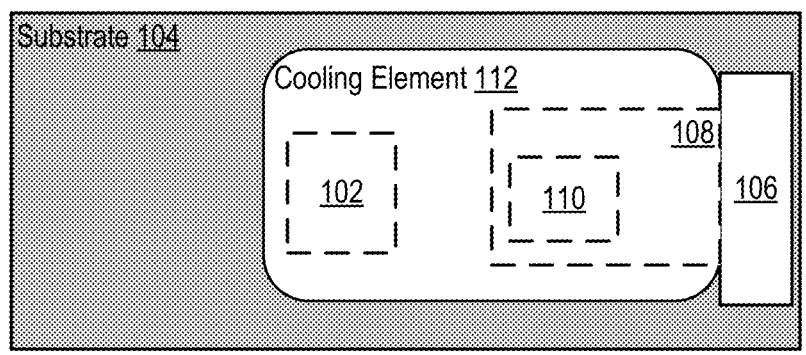
FIG. 2 is a diagram of an example apparatus for a common cooling solution for multiple packages according to some embodiments.

For further explanation, FIG. 2 shows an alternative view of the example apparatus 100 for a common cooling solution for multiple packages of FIG. 1 according to embodiments of the present disclosure. FIG. 2 shows an overhead view of the apparatus 100. FIG. 2 shows the substrate 104 and cooling element 112. Under the cooling element 112 is an APU die package 102 bonded to the substrate. Also under the cooling element 112 is the dGPU substrate 108 and dGPU die package 110. Accordingly, both the APU die package 102 and dGPU die package 110 are in contact with, and therefore thermally coupled to, an underside surface of the cooling element 112. The dGPU substrate 108 is installed in the peripheral interface 106. Although FIG. 2 shows the dGPU substrate 108 as being fully covered by the cooling element 112, it is understood that only the dGPU die package 110 need to be under the cooling element 112 to allow for cooling of the dGPU die package 110 by the cooling element 112.

In some embodiments, a common cooling solution for multiple packages is implemented in an example computing device 300. The computing device 300 includes an Accelerated Processing Unit (APU) 302. The APU 302 is a microprocessor that includes a central processing unit (CPU) 304 and integrated graphics processing unit (iGPU) 306 on a single die. The computing device 300 also includes a discrete graphics processing unit (dGPU) 308. Although the approaches set forth herein are described in the context of an computing device 300 including a dGPU 308 and an APU 302 with an iGPU 306, it is understood that the approaches set forth herein are applicable to any system or device incorporating both integrated and discrete GPUs. The dGPU 308 is a peripheral or additional component of the computing device 300 operatively coupled to the APU 302. For example, in some embodiments the dGPU 308 is operatively coupled to the APU 302 by a peripheral component interface express (PCIe) bus. Accordingly, in such an embodiment, the dGPU 308 is installed in a PCIe port on a motherboard or other printed circuit board (PCB) into which the APU 302 is installed. By virtue of the operable connection between the APU 302 and the dGPU 308, the APU 302 is capable of issuing instructions, rendering jobs, and the like, to the dGPU 308. In some embodiments, the dGPU 308 includes a display interface 309. The display interface 309 is a port or socket to which an external monitor or display is connected. The display interface 309 provides a video signal to the external display for presentation. The display interface 309 includes, for example, a High Definition Multimedia Interface (HDMI) port, a Video Graphics Array (VGA) port, a Digital Visual Interface (DVI) port, a Universal Serial Bus C (USB-C) port, or other display port as can be appreciated.

The iGPU 306 and dGPU 308 each include one or more video cores 312. A video core 312 is a discrete processing unit, core, or other unit of hardware resources dedicated to encoding and decoding video data. For example, each video core 312 facilitates video encoding or decoding operations such as decoding streaming video content, encoding video for video conferencing applications, encoding video files for later playback, and the like. In some embodiments, the video core 312 implements particular hardware architectures or configurations for video encoding and decoding, such as Video Core Next (VCN).

The iGPU 306 and dGPU 308 also each include one or more compute units 314. Each compute unit 314 includes one or more cores that share a local cache, allowing for parallel processing and cache access for each core within a given compute unit 314. The compute units 314 facilitate various calculations and processing jobs submitted to the iGPU 306 and dGPU 308, including rendering operations, machine learning operations, and the like.

The iGPU 306 and dGPU 308 also each include a display engine 316. Each display engine 316 manages the presentation of video or image content to a display of the computing device 300 (e.g., an internal mobile device display or an external display coupled to a display interface 310). In some embodiments, the display engines 316 implement display core technology such as Display Core Next (DCN) and the like. The APU 302 also includes an audio co-processor (ACP) 318. The ACP 318 is a core, processor, or other allocation of hardware components dedicated to audio encoding and decoding.

Figure 3:
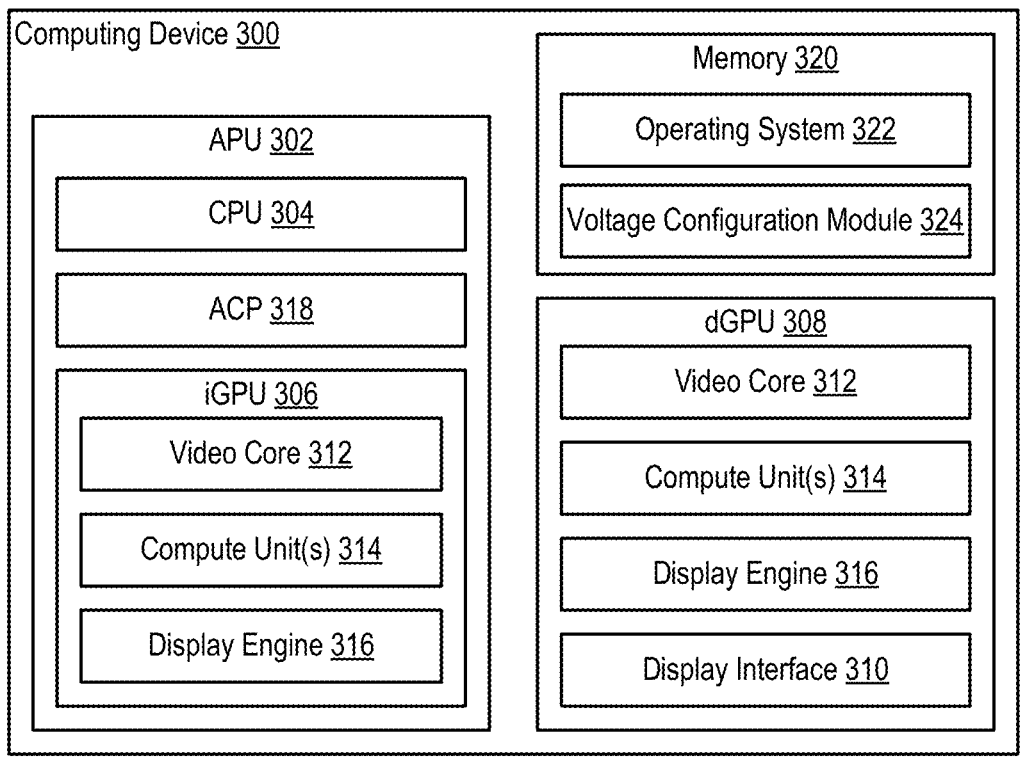
FIG. 3 is a block diagram of an example computing device for a common cooling solution for multiple packages according to some embodiments.

The computing device 300 also includes memory 320 such as Random Access Memory (RAM). Stored in memory 320 is an operating system 322 and a voltage configuration module 324. The operating system 322 and voltage configuration module 324 in the example of FIG. 3 are shown in memory 320, but many components of such software typically are stored in non-volatile memory also, such as, for example, on a disk drive or other storage medium. Operating systems 322 useful in the computing device 300 according to certain embodiments include UNIX™, Linux™, Microsoft Windows™, and others as will occur to those of skill in the art.

The voltage configuration module 324 is a module for controlling the voltage allocated to the APU 302 and dGPU 308. For example, the voltage configuration module 324 implements SmartShift technology to allocate voltage in order to increase performance for particular applications. Depending on the particular workload executed in the computing device 300, the voltage configuration module 324 increases or decreases the voltage used by the APU 302 and dGPU 308. As an example, for a workload that relies on the dGPU 308 heavily, such as complex graphics rendering, the voltage configuration module 324 will increase the voltage to the dGPU 308. As another example, for a workload that relies on the APU 302 more than the dGPU 308 such as audio encoding, or when the computing device 300 is in a low power consumption state, the voltage configuration module 324 will increase the voltage to the APU 302. In some embodiments, an increase to the voltage of one component (e.g., to the APU 302 and dGPU 308) will cause or be performed in response to a decrease in the voltage of the other component.

In some embodiments, a modification to the voltage of a given component will cause or be performed in response to a modification in operating frequency of the given component. For example, assume that a command or request is issued to increase the operating frequency of the dGPU 308 in response to a rendering job being submitted to the dGPU 308. The voltage configuration module 324 will then increase the voltage provided to the dGPU 308 so that the dGPU 308 is able to operate at the increased frequency. In some embodiments, the frequency of a given component is defined according to a frequency voltage curve. A frequency voltage curve defines a relationship between the frequency of a component and its corresponding voltage. In other words, the frequency voltage curve defines, for a given frequency, a corresponding voltage for the component.

One skilled in the art will appreciate that the voltage configuration module 324 operates within various constraints for voltages in the computing device 300. For example, in some embodiments, the APU 302 and dGPU 308 have defined minimum and maximum safe voltages. One skilled in the art will appreciate that the particular voltage limits for the APU 302 and dGPU 308 are dependent on particular cooling and thermal solutions implemented in the computing device 300.

One skilled in the art will also appreciate that the approaches described herein for a common cooling solution for multiple packages provide for increased cooling capabilities for the APU 302 and dGPU 308, allowing for increased maximum safe operational voltages for both the APU 302 and dGPU 308. Thus, a computational performance increase is achieved though the improved cooling approaches described herein.

Figure 4:
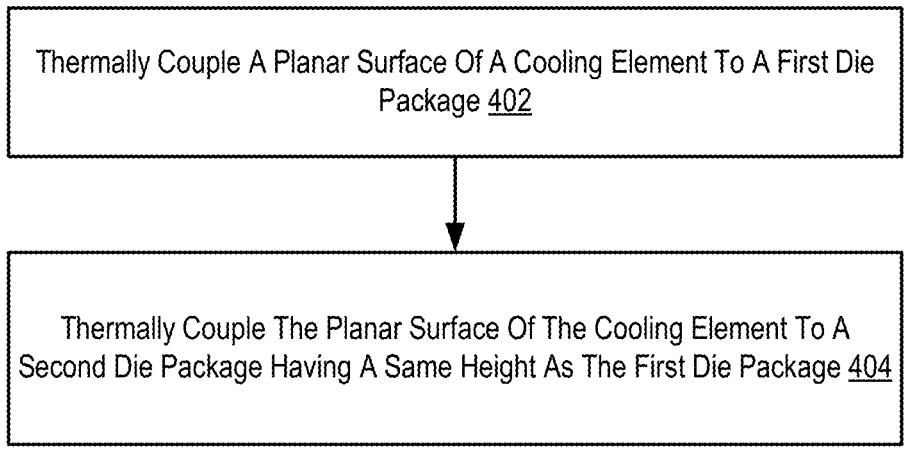
FIG. 4 is a flowchart of an example method for a common cooling solution for multiple packages according to some embodiments.

For further explanation, FIG. 4 sets forth a flow chart illustrating an example method for a common cooling solution for multiple packages that includes thermally coupling 402 a planar surface of a cooling element 112 to a first die package. In some embodiments, the first die package includes an APU die package 102 as described in FIG. 1. In some embodiments, the first die package includes a CPU die package, or other die package as can be appreciated. The cooling element 112 is implemented as any of a variety of cooling elements 112 for computing device components, including fluid cooling (e.g., water cooling), heat pipes, vapor chambers, heat sinks, radiator fins, fans, and the like. The planar surface of the cooling element 112 is a bottom surface of the cooling element 112 that is able to contact multiple die packages using a single, substantially continuous planar surface of conductive material (e.g., copper). In other words, the planar surface of the cooling element 112 is substantially level and parallel to each of multiple die packages cooled by the cooling element 112.

In some embodiments, thermally coupling 402 the planar surface of the cooling element 112 to the first die package includes mounting, attaching, or coupling the cooling element 112 to a substrate 104 to which the first die package is bonded. For example, the cooling element 112 is mounted or attached to a printed circuit board of a computing device to which the first die package is installed. After mounting the cooling element 112 to the substrate 104, the planar surface (e.g., bottom surface) of the cooling element 112 contacts the first die package or a layer of thermal interface material applied to the first die package.

The method of FIG. 4 also includes thermally coupling 404 the planar surface of the cooling element 112 to a second die package having a same height as the first die package. In some embodiments, the second die package is a dGPU die package 110 of a dGPU. In other embodiments, the second die package is a CPU die package. In further embodiments, the second die package is an iGPU die package, or other die package as can be appreciated.

The first die package and second die package are of the same height in that a surface (e.g., a top surface) the first die package and second die package are substantially coplanar after installation. For example, assuming the first die package is an APU die package 102 and the second die package is a dGPU die package 110, the APU die package 102 and dGPU die package 110 have the same height after the APU die package 102 is bonded to a substrate 104 and a dGPU including the dGPU die package 110 is coupled to the substrate (e.g., by installation in a peripheral interface 106 or other interface).

As the first die package and second die package are of the same height, the cooling element 112 is thermally coupled to both the first die package and the second die package using a layer of conductive material that is substantially uniform in thickness and whose bottom surface (e.g., the planar surface) is substantially continuously planar. In other words, the layer of conductive material in the cooling element 112 forms a thermal coupling to the first die package and the second die package without variations in thickness (e.g., a gradual increase in thickness or a step-like formation) to accommodate for any variations in height between the first die package and the second die package. For example, the cooling element 112 includes a plate of conductive material of substantially uniform thickness that, when the cooling element 112 is installed, uniformly contacts the first die package and the second die package. Moreover, as the first die package and second die package are of the same height, and installation of the cooling element 112 on the substrate 104 to which the first die package will thermally couple the cooling element 112 to both the first die package and the second die package.

Figure 5:
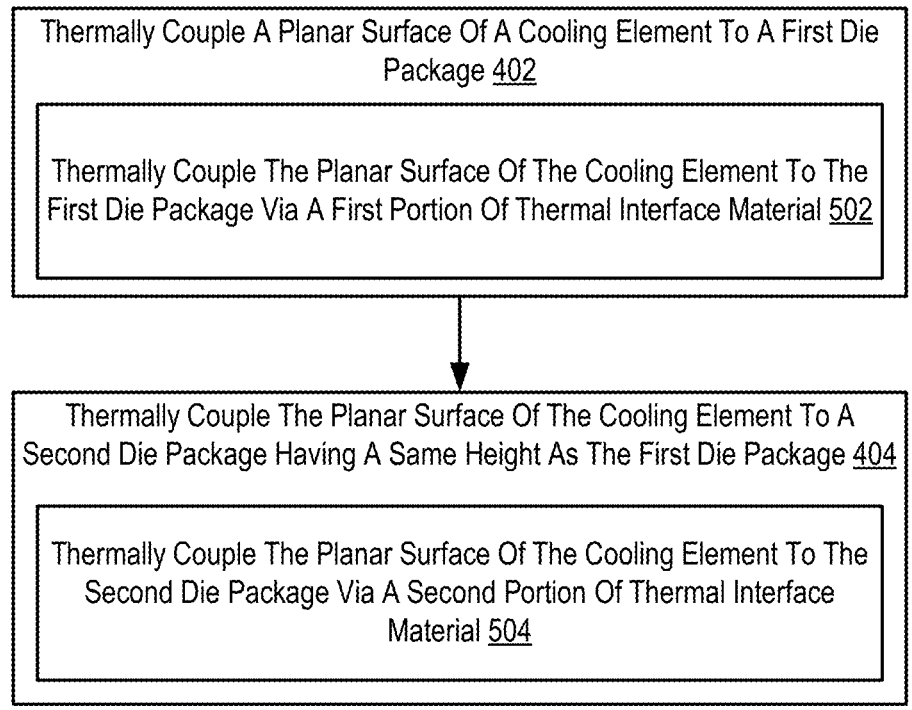
FIG. 5 is a flowchart of another example method for a common cooling solution for multiple packages according to some embodiments.

For further explanation, FIG. 5 sets forth a flow chart illustrating another example method for a common cooling solution for multiple packages according to some embodiments of the present disclosure. The method of FIG. 5 is similar to FIG. 4 in that the method of FIG. 5 includes thermally coupling 402 a planar surface of a cooling element 112 to a first die package; and thermally coupling 404 the planar surface of the cooling element 112 to a second die package having a same height as the first die package.

FIG. 5 differs from FIG. 4 in that thermally coupling 402 a planar surface of a cooling element 112 to a first die package includes thermally coupling 502 the planar surface of the cooling element 112 to the first die package via a first portion of thermal interface material 114. FIG. 5 further differs from FIG. 4 in that thermally coupling 404 the planar surface of the cooling element 112 to a second die package having a same height as the first die package includes thermally coupling 504 the planar surface of the cooling element 112 to the second die package via a second portion of thermal interface material 114.

The thermal interface material 114 includes, for example, thermal paste, thermal pads, or other materials that provide a thermally conductive link between a given die package and the cooling element 112, thereby eliminating air gaps between the given die package and the cooling element 112. For example, thermal interface material 114 is applied to the first die package and the second die package before the cooling element 112 is installed in an apparatus or computing device including the first die package and the second die package. Thus, the planar surface of the cooling element 112 (e.g., the bottom layer of conductive material) contacts the thermal interface material 114, and heat is transferred between the first and second die and the cooling element 112 via the thermal interface material 114.

The portions of thermal interface material 114 applied to the first and second die packages are of substantially the same thickness. Thus, a height of the first die package and applied thermal interface material 114 is substantially the same as a height of the second die package and the applied thermal interface material 114. This allows the planar surface of the cooling element 112 to contact the applied portions of thermal interface material 114 as the planar surface is substantially continuously planar. Moreover, as the portions of thermal interface material 114 applied to the first and second die packages are of substantially the same thickness, the thermal resistance increase caused by the thermal interface material 114 is substantially the same between the first and second die packages. Thus, as the first and second die packages are of the same height, neither the first nor the second die package are subject to an increased thermal resistance that would arise if one die package required additional layers of thermal interface material 114 to accommodate for any height differences between die packages.

In view of the explanations set forth above, readers will recognize that the benefits of a common cooling solution for multiple packages include:

Improved performance of a computing system by allowing for cooling of multiple die packages using a single cooling element, saving power and internal space for computing devices.

Improved performance of a computing system by reducing the thermal resistance between die packages and cooling elements, thereby increasing the cooling capabilities of the die packages and providing for increased maximum operating voltages for the die packages.

Exemplary embodiments of the present disclosure are described largely in the context of a fully functional computer system for a common cooling solution for multiple packages. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure.

It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. An apparatus comprising:
a first die package bonded to a first substrate;
a second die package bonded to a second substrate, the second substrate coupled to the first substrate; and
a cooling element thermally coupled to the first die package and the second die package by a planar surface of the cooling element, wherein only one side of each of the first die package and the second die package are coplanar and directly thermally coupled to the cooling element via a first portion of a thermal interface material and a second portion of the thermal interface material, respectively.

2. The apparatus of claim 1, wherein the first die package comprises an application processing unit (APU) die package.

3. The apparatus of claim 1, further comprising a discrete graphics processing unit (dGPU) comprising the second substrate and the second die package.

4. The apparatus of claim 1, wherein
the first portion of the thermal interface material and the second portion of the thermal interface material are of a substantially same thickness.

5. The apparatus of claim 1, wherein the first portion of the thermal interface material or the second portion of the thermal interface material comprises a thermal paste.

6. The apparatus of claim 1, wherein the cooling element comprises a fluid-cooled cooling element.

7. The apparatus of claim 1, wherein the planar surface of the cooling element comprises a surface of a layer of conductive metal.

8. A semiconductor chip device comprising:
a semiconductor chip substrate;
a first die package mounted on the semiconductor chip substrate, the first die package comprising an exposed surface; and
a second die package bonded on a second substrate and electrically coupled to the semiconductor chip substrate, the second substrate coupled to the semiconductor chip substrate, the second die package having an exposed surface at a same height as the first die package, wherein the exposed surface of the first die package and the second die package are configured to be thermally coupled to a cooling element, wherein only one side of each of the first die package and the second die package are coplanar and directly thermally coupled to the cooling element via a first portion of a thermal interface material and a second portion of the thermal interface material, respectively.

9. The apparatus of claim 1, wherein the second die package is coupled to the first substrate via a peripheral interface.

10. The semiconductor chip device of claim 8, wherein the first die package comprises an application processing unit (APU) die package.

11. The semiconductor chip device of claim 8, further comprising a discrete graphics processing unit (dGPU) comprising the second substrate and the second die package.

12. The semiconductor chip device of claim 8, wherein:
the first portion of the thermal interface material and the second portion of the thermal interface material are of a substantially same thickness.

13. The semiconductor chip device of claim 8, wherein the first portion of thermal interface material or the second portion of thermal interface material comprises a thermal paste.

14. The semiconductor chip device of claim 8, wherein the second die package is coupled to the semiconductor chip substrate via a peripheral interface.

15. A method for a common cooling solution for multiple packages, comprising:
thermally coupling a planar surface of a cooling element to a first die package bonded to a first substrate; and
thermally coupling the planar surface of the cooling element to a second die package bonded to a second substrate, wherein the second substrate is coupled to the first substrate, and only one side of each of the first die package and the second die package are coplanar and directly thermally coupled to the cooling element via a first portion of a thermal interface material and a second portion of the thermal interface material, respectively.

16. The method of claim 15, wherein:
the first portion of thermal interface material and the second portion of thermal interface material are of a substantially same thickness.

17. The method of claim 15, wherein the first die package comprises an application processing unit (APU) die package.

18. The method of claim 15, wherein the second die package comprises a discrete graphics processing unit (dGPU) die package.

19. The method of claim 15, wherein the cooling element comprises a fluid-cooled cooling element.

20. The method of claim 15, wherein the planar surface of the cooling element comprises a surface of a layer of conductive metal.

* * * * *